United States Patent [19]

McPherson

[11] Patent Number: 4,859,989

[45] Date of Patent: Aug. 22, 1989

[54] SECURITY SYSTEM AND SIGNAL CARRYING MEMBER THEREOF

[75] Inventor: Hugh McPherson, Milnathort, Scotland

[73] Assignee: W. L. Gore & Associates, Inc., Newark, Del.

[21] Appl. No.: 126,670

[22] Filed: Dec. 1, 1987

[51] Int. Cl.[4] .......................... G08B 29/00; H01B 7/00
[52] U.S. Cl. ..................................... 340/510; 340/550; 340/564; 340/590; 340/598; 340/596; 340/647; 174/120 SC
[58] Field of Search ............... 340/510, 550, 590, 564, 340/596, 598, 647–651; 174/102 SC, 105 SC, 106 SC, 120 SC

[56] References Cited

U.S. PATENT DOCUMENTS

| | | | |
|---|---|---|---|
| 2,581,213 | 1/1952 | Spooner, Jr. | 340/596 |
| 2,691,698 | 10/1954 | Schmidt | 340/647 |
| 3,633,194 | 1/1972 | Kothe | 340/550 |
| 3,748,369 | 7/1973 | Durakis et al. | 174/102 SC |
| 3,750,127 | 7/1973 | Ayers et al. | 340/596 |
| 3,763,482 | 10/1973 | Burney et al. | 340/564 |
| 4,155,083 | 5/1979 | Slaats et al. | 340/564 |
| 4,450,434 | 5/1984 | Nielsen et al. | 340/564 |
| 4,453,159 | 6/1984 | Huff et al. | 340/590 |

Primary Examiner—Donnie L. Crosland
Attorney, Agent, or Firm—Dena Meyer

[57] ABSTRACT

A security system comprising a signal-carrying member and a detector for detecting a change in the resistance of the conductive path surrounding a core of the signal-carrying member. The conductive path comprises inner and outer layers of semi-conductive tape separated by an insulating layer but interconnected at one end. The semi-conductive tape of at least the outer layer is made of fibrous material such as carbon-leaded PTFE such that when a sharp object pierces the outer layer and the insulating layer, semi-conductive fibers are dragged from the outer layer into contact with the inner layer and form a conductive bridge between the layers.

11 Claims, 8 Drawing Sheets

SECURITY SYSTEM AND SIGNAL CARRYING MEMBER THEREOF

FIELD OF THE INVENTION

This invention relates to a security system for giving warning of attempted interference with an object to be protected. The system is particularly applicable to the protection of an elongate core, such as an electrical power or data-carrying core, optical fibres, or pipelines and tubes carrying air or other fluids.

BACKGROUND OF THE INVENTION

In the case of a data-carrying core, such as telephone or computer lines, it is important to provide security from wire tapping or eavesdropping on confidential information carried by the core, and to protect data lines used for electronic transfer of money between financial institutions. This it is necessary not only to stop information being extracted but also to stop erroneous information being added or current information being changed.

There is also a need for detecting imminient failure of a core which is fundamental to the safety or operation of a control system such as an aircraft hydraulic system or a missle fire control system.

SUMMARY OF THE INVENTION

According to the present invention there is provided a signal-carrying member for a security system comprising a core surrounded by means capable of transmitting an electrical signal, an electrically-insulating layer surrounding the core and said means capable of transmitting a signal, and a semi-conductive layer surrounding the insulating layer, the semi-conductive layer incorporating throughout semi-conductive fibres which protrode from the layer when the layer is pierced, the thickness of the insulating layer being substantially less than the length of such protruding fibres whereby piercing of the semi-conductive layer and the insulating layer by an object entering from outside and moving towards the core will cause semi-conductive fibres from the semi-conductive layer to be pushed through the insulating layer and form a conductive path between the semi-conductive layer and said means capable of transmitting a signal.

DESCRIPTION OF THE PREFERRED EMBODIMENTS

Figure 1:
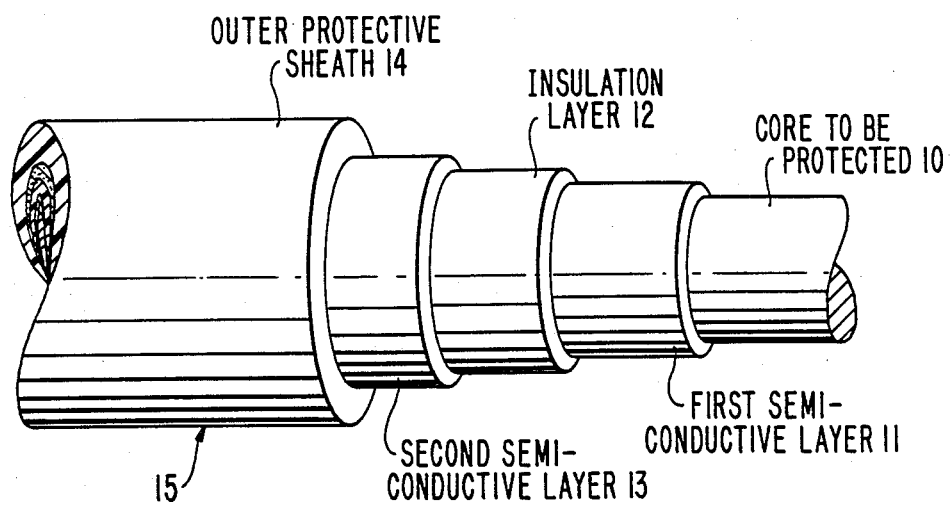
FIG. 1 is a diagrammatic perspective view of a security system including a core surrounded by two semi-conductive layers separated by an insulating layer.

In FIG. 1, there is shown a simple form of wrapped core 10 forming a signal-carrying member which, together with a detector, forms a security system in accordance with the invention.

The core 10, which can be a fluid-carrying tube but usually will be an electric cable, is wrapped with a first semi-conductive layer 11, then with an electrically insulating layer 12, and thereafter with a second semi-conductive layer 13, and around this an outer protective sheath 14 is formed. This represents a basic form of signal-carrying member 15. If however the core were provided with a conductive surface, for example a metal braid, itself forming a means capable of transmitting an electrical signal, the inner semi-conductive layer could be dispensed with. Nevertheless, preferably the inner semi-conductive layer would still be retained.

In order to form a smooth wrapping, the semi-conductive layer and the insulation layer are both formed to tape which is wrapped helically around the core to 0.95 wraps, i.e. with a gap of 5% or thereabouts between turns to prevent overlap. Although each of the first three layers could be applied by extrusion, wrapping is the preferred method. The protective sheath is conveniently a 0.5 mm PVC coating applied by extrusion.

The or each semi-conductive layer is made throughout of a fibrous material such that when a sharp object penetrates the wrapped layers surrounding the core the object will pull fragments of the outer semi-conductive layer 13 through the insulating layer 12 to touch, and so make electrical contact with, the inner semi-conductive layer 11. In order to have a high probability of a conductive path being made, th insulating layer 12 should be thinner than the mean length of the conductive fibres produced by pushing the object through the semi-conductive layer. The insulating layer 12 should therefore be no thicker than, and preferably is thinner than, the semi-conductive layer 13.

The preferred semi-conductive material is unsintered, carbon-loaded polytetrafluoroethylene (PTFE) tape having a volume restivity of 1.0 ohm-cm or lower. The preferred insulating material is polyester film 0.001 inch (0.0025 cm) maximum thickness coated with 0.0005 inch (0.0013 cm) polyester adhesive. The insulating layer is wrapped to 1.1 wraps and subsequently sealed by passing the wrapped construction through an oven at 200° C.

By making the layers as above, two restrictive tracks are formed having a loop resistance of approximately 7k ohms per metre run. By terminating the layers at the far end with a resistor of value greater than 1 meter loop resistance, say 10k ohms, the total loop resistance may be monitored using a Wheatstone Bridge-type of device. Changes in the loop resistance will indicate a penetration of the layers, and measurement of this new loop resistance will indicate the distance along the core to the fault.

Figure 2:
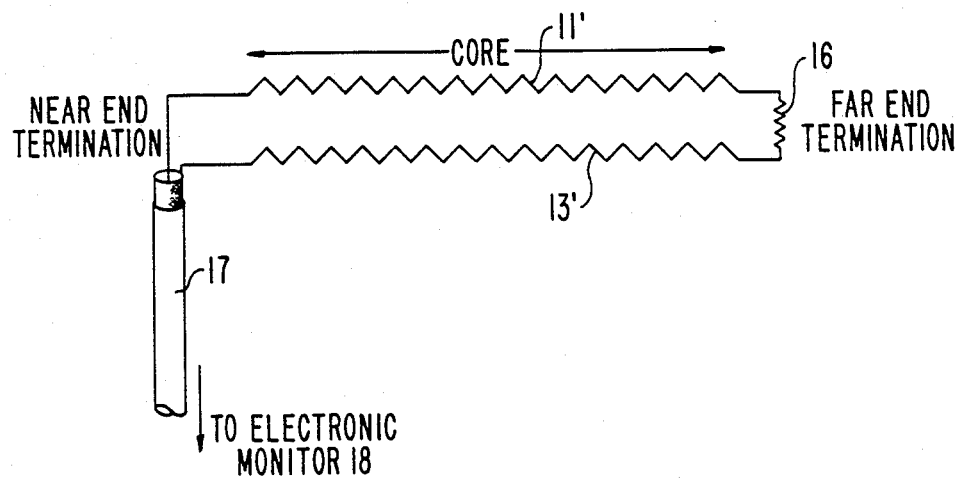
FIG. 2 is part of a circuit diagram of a simple security system according to the present invention.

A simple circuit for the signal carrier of FIG. 1 is shown in FIG. 2 where the elongate resistors 11', 13' formed by the inner and outer semi-conductive layers 11, 13 are interconnected at one end by a resistor 16. At their opposite end the resistors are connected by a flying lead 17 to an electronic monitor 18. This monitor is capable of detecting a change in the total resistance of the resistors 11', 13', 16 resulting from shorting across between the semi-conductive layers 11, 13. The flying lead 17 is preferably a screened wire which filters high frequency signals. The monitor 18 is described in detail below.

Thus a simple detection system has been formed which will indicate penetration of the core wrapping by an object and hence potential failure of, or interference with, the core. Alternatively it can be used as a "distance-to fault" indicator, for example for underground cable.

Although the embodiment of FIG. 1 would protect against accidental penetration, it could be overcome by a criminal of modest skill who was aware of its construction.

Figure 3:
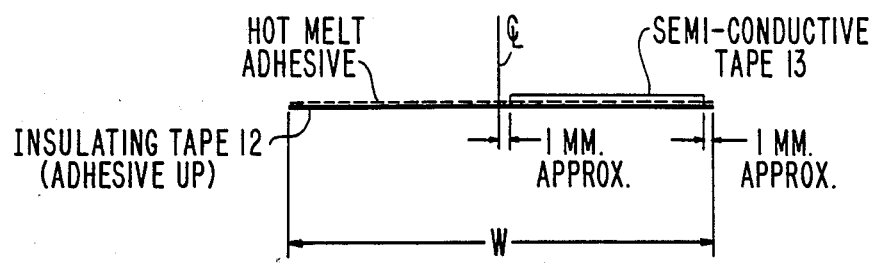
FIG. 3 illustrates the production of a lmainated tape comprising an insulating layer and a semi-conductive layer.
Figure 4:
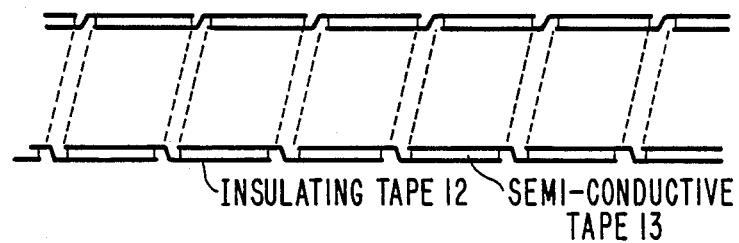
FIG. 4 is a diagrammatic representation of the wrapping of the laminated tape of FIG. 3 around a core.

To provide a more secure system, an interleaved wrap can be used. The construction firstly has a semi-conductive layer 11 applied over the core 11 as in FIG. 1. A laminate of insulating tape 12 and semi-conductive tape 13, as shown in FIG. 3, is then formed. In the laminate, the semi-conductive tape 13 extends over slightly less than the half width of the insulating tape to one side of the centre line of the insulating tape 12, and is secured to the insulating tape by hot melt adhesive. The laminate is then wrapped helically with overlap as shown diagrammatically in FIG. 4. The width of the insulating tape is chosen to give a nominal 2-wrap construction using the known theory of tape wrapping. The semi-conductive tape width is $(0.05 \times 0)$-2 mm$\times$W where W is the width in millimeters of the insulating tape. Thus a semi-conductive track is wrapped around a core such that each turn of semi-conductive tape is insulated from the next turn and is insulated above and below in one operation. In practice, the gap shown between each turn in FIG. 4, for ease of illustration, is closed by fine adjustment of the wrapping angle.

Figure 5:
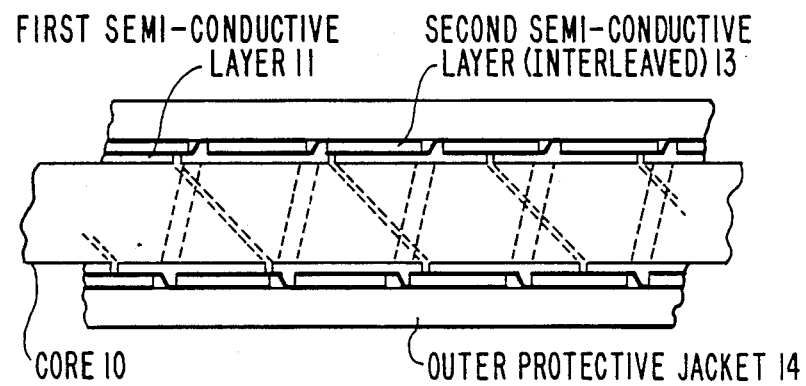
FIG. 5 is a diagrammatic representation of a complete cable incorporating the tape of FIG. 3.

FIG. 5 illustrates a completely wrapped core using th laminated tape of FIG. 3. It also demonstrates the preferable method of wrapping the outer semi-conductive layer 13 in the opposite direction to the inner semi-conductive layer 11.

The preferred material would be 0.001 inch (0.0025 cm) thick polyester film coated with 0.0005 inch (0.0013 cm) hot melt adhesive (polyester) for the insulation, and 0.003 inch (0.0076 cm) thick semi-conductive PTFE tape, of the same electrical and mechanical properties as used in FIG. 1, for the semi-conductive layer. The outer sheath may be made of any convenient thermoplastic material and preferably PVC or polyurethane.

The interleaved layer increases the difficulty of intentional interception compared to the FIG. 1 construction, since the layers must be very carefully pared away to gain access to the core, without either cutting through the outer layer and causing an open circuit or shorting the two layer together. The construction of FIG. 5 may be further complicated by adhering the layers together by coating the core in an adhesive before the first layer is applied, after the first layer, and after the second layer (interleaved) thus mechanically securing each layer to avoid the possibility of lifting the wraps and gaining access with a fine probe.

Alternatively, both first and second semi-conductive layers can be wrapped using the laminated tape of FIG. 3. This further complicates the act of interception, particularly if adhesive is applied between the layers. The semi-conductive layer in FIG. 4 will be thicker than that of FIG. 1 because of the extra insulation thickness and would preferably be 0.005 inch (0.013 cm) thick.

Figure 6:
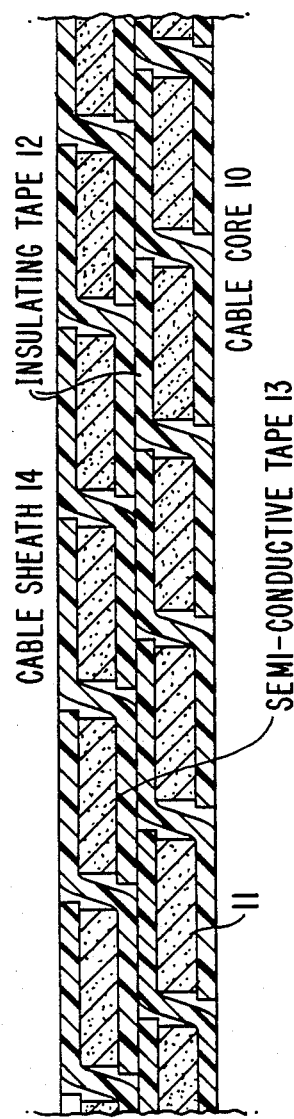
FIG. 6 is longitudinal section through part of the wrapping of a cable incorporating a double wrap of tape according to FIG. 3.
Figure 7:
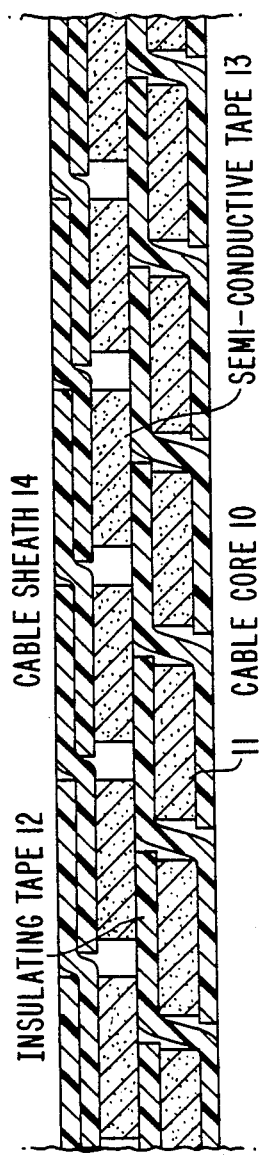
FIG. 7 is a longitudinal section through part of the wrapping of a cable incorporating a double wrap of a modified form.
Figure 8:
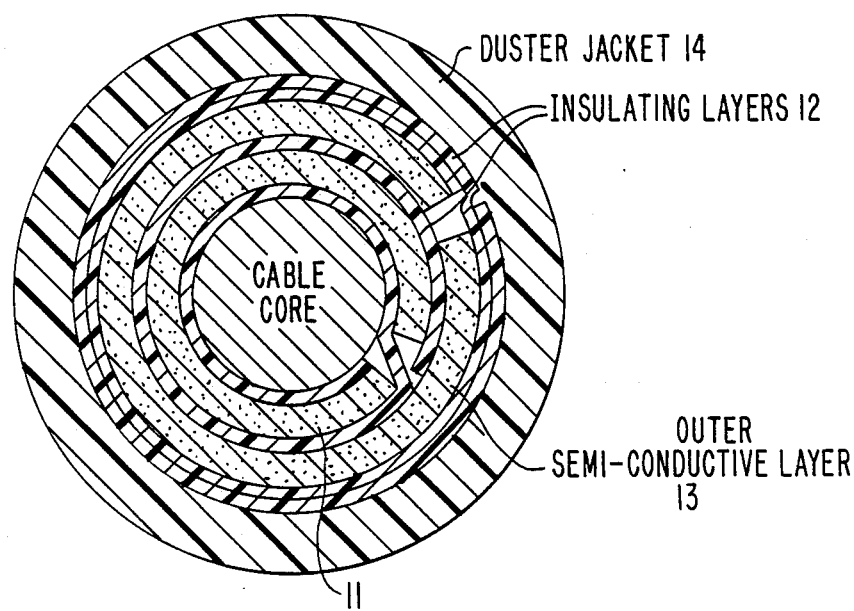
FIG. 8 is a section through a cable in accordance with the present invention.

FIG. 6 illustrates wrapping of the core with the laminated tape having the semi-conductive layer on the outside of the tape for both inner and outer wraps. This provides a double layer of insulating tape between the semi-conductive layers. In FIGS. 7 and 8, the second wrap is wound with the semi-conductive layer on the inside of the tape. This provides a single layer of insulating tape between the semi-conductive layers.

Figure 9:
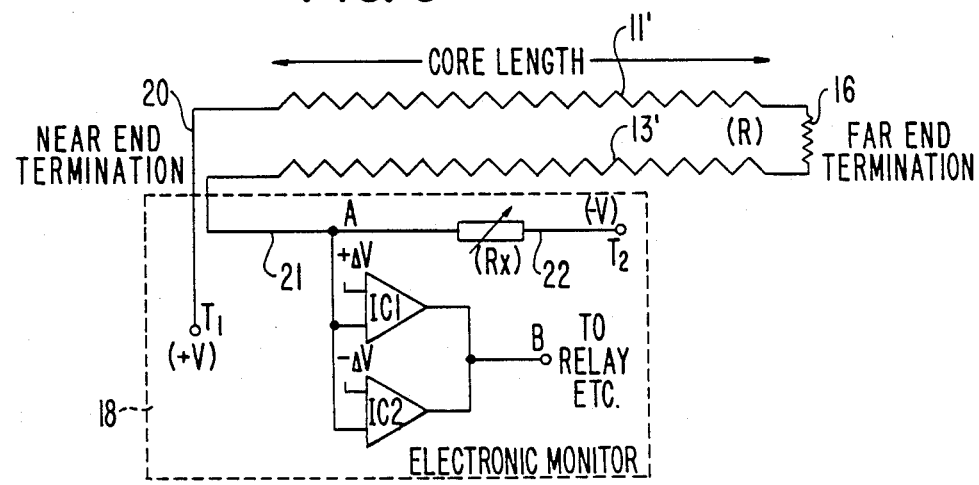
FIG. 9 is a circuit diagram of a simple security system according to the present invention.

The monitor 18 is illustrated in FIG. 9 which shows the conductor 20 of the flying lead connected to a terminal $T_1$ at $+V$ and the other conductor 21 of the flying lead connected through a variable resistor 22 of value Rx to a terminal $T_2$ at $-V$ volts. Comparator integrated circuits IC1 and IC2 are connected with the terminals $T_1$ and $T_2$ and with the resistor 22 and the line resistor, formed by the series connected resistors 11', 13', 16 and having resistance R, in a bridge circuit coupled at node A between resistors 13' and 22 and at B to an output device which may include relays. If Rx is set to the same resistance value R as the total loop resistance of the detection layers, and $+\Delta V$ and $-\Delta V$ are of equal and opposite very small values, such as $+/-20$ mv, then node 'A' is at zero volts, and the circuit works as a window comparator. Any small change to the loop resistance R will result in either IC1 or IC2 switching to give an output voltage at B. This in turn ca be used to operate a relay or other latching device which can initiate an alarm.

Temperature fluctuations will affect the loop resistance of the detection layer, this being a well-known feature of semi-conductive plastics, and for a detection layer that has to work for long periods in large fluctuating temperatures it is necessary to incorporate some form of compensating circuit. For example, if resistor 22(Rx) in FIG. 9 is replaced with a resistive element of the same material as the detection layer and is exposed to the environment of the detection layer, then the loop resistance of the detection layer and Rx will compensate for each other and Node 'A' will remain a zero volts.

Figure 10:
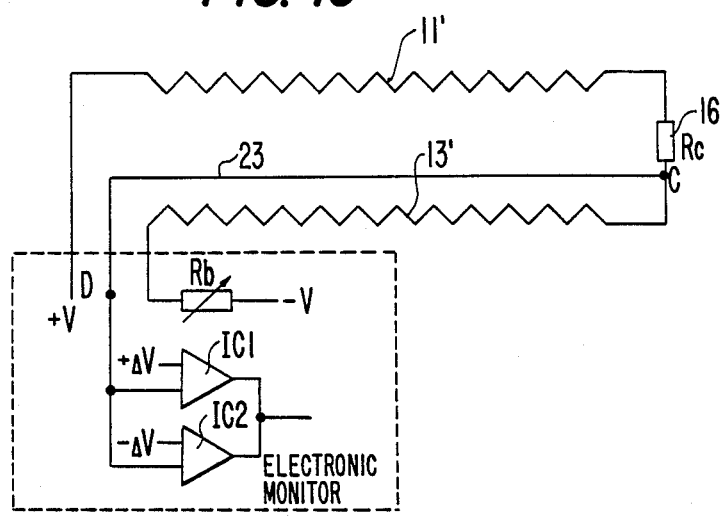
FIG. 10 is a circuit diagram of a more complex security system according to the present invention.
Figure 11:
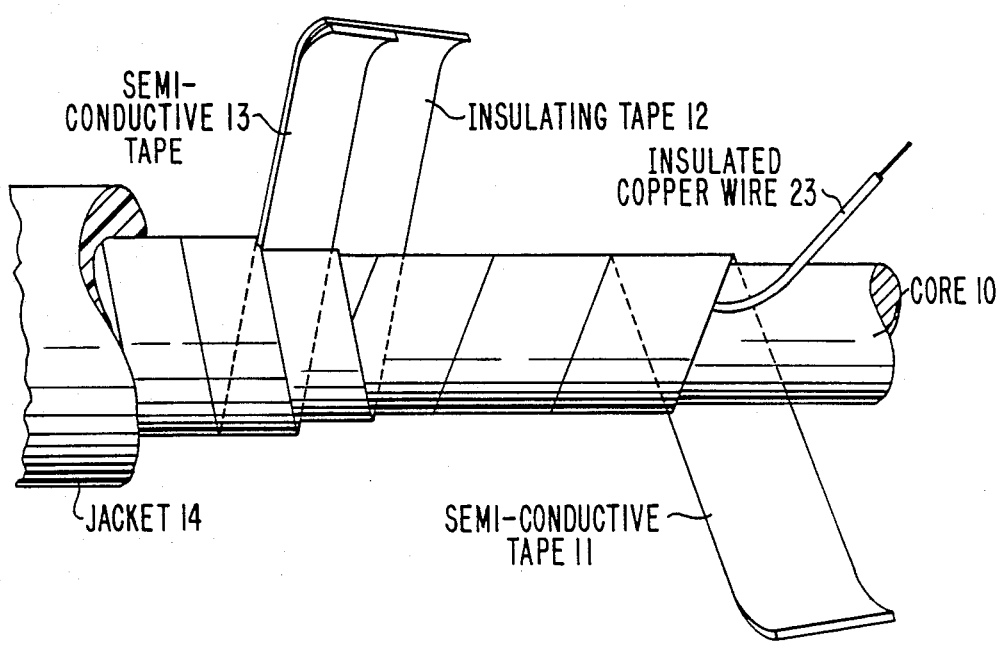
FIG. 11 is a diagrammatic illustration of the wrapping of a cable for use with the circuit of FIG. 10.

Alternatively, a circuit such as that of FIG. 10 can be used. In this system, two arms of the bridge are formed from the two semi-conductive layers, and a return 23 is taken from the far end at C to Node D at the input to IC1 and IC2. If the two layers are nominally of the same resistance and Rb is equal to the value of resistor 16 (Rc) then Node D is zero volts. In practice this return is a very fine insulated copper wire, preferably 32 AWG or smaller, and is laid under the first layer as shown in FIG. 11. This basic principle can be used with any of the preceding examples.

Figure 12:
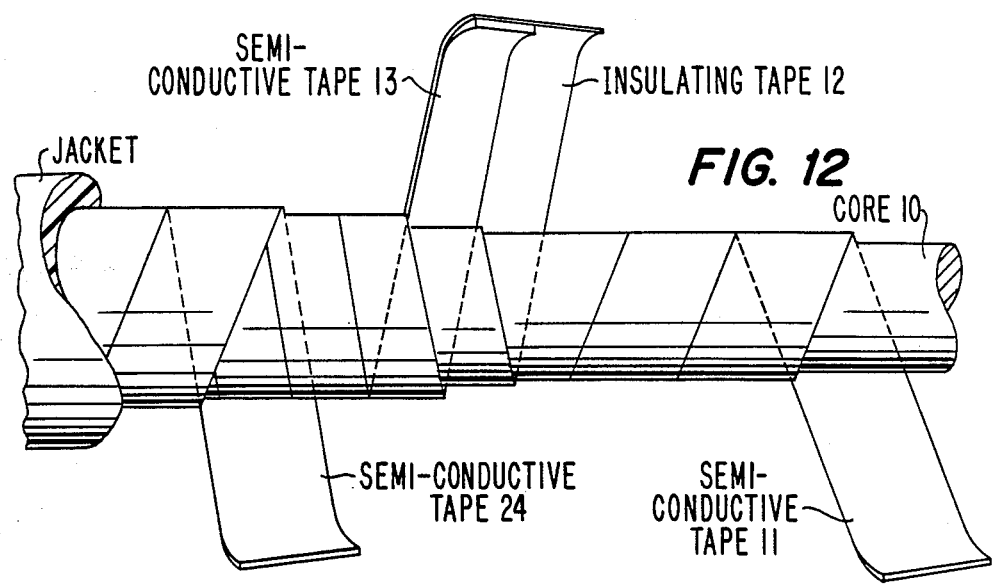
FIG. 12 is a diagrammatic illustration of an alternative method of wrapping a cable.

A further option to increase the detection layers resistance to attack is to apply a third semi-conductive layer as in FIG. 12 where the copper return wire 23 (shown in FIG. 11) is replaced by a semi-conductive layer 24. This considerably enhances the detection of intentional interception since a third semi-conductive layer introduces a number of variations utilising all the designs shown and thus offers a high level of design uncertainty to any interceptor.

Further modifications of the detection layer are provided by introducing a multiplicity of semi-conductive elements. This may, of course, be done by adding more layers and incorporating a further randomness such that any intentional interceptor does not known the exact design of the layers.

Figure 13:
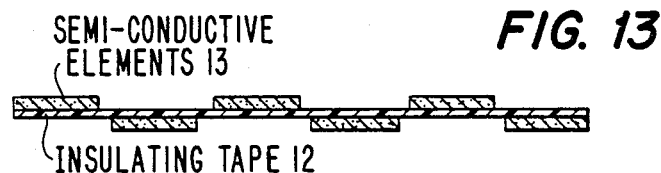
FIG. 13 is a longitudinal section through another embodiment of laminated tape for use in the system of the present invention.
Figure 14:
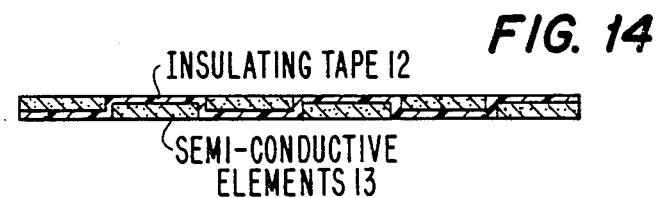
FIG. 14 is a section through the tape of FIG. 13 after rolling.

Another way of incorporating a multiplicity of semi-conductive elements is to segment the semi-conductive tape into separate parallel spaced elements. The elements are laid as shown in FIG. 13, and compressed between plain rollers to produce a tape as in FIG. 14. If a maleable material is used such as unsintered PTFE for both the semi-conductive elements and the insulating tape, the new tape is homogeneous in appearance and is easily handled as single tape.

Figure 15:
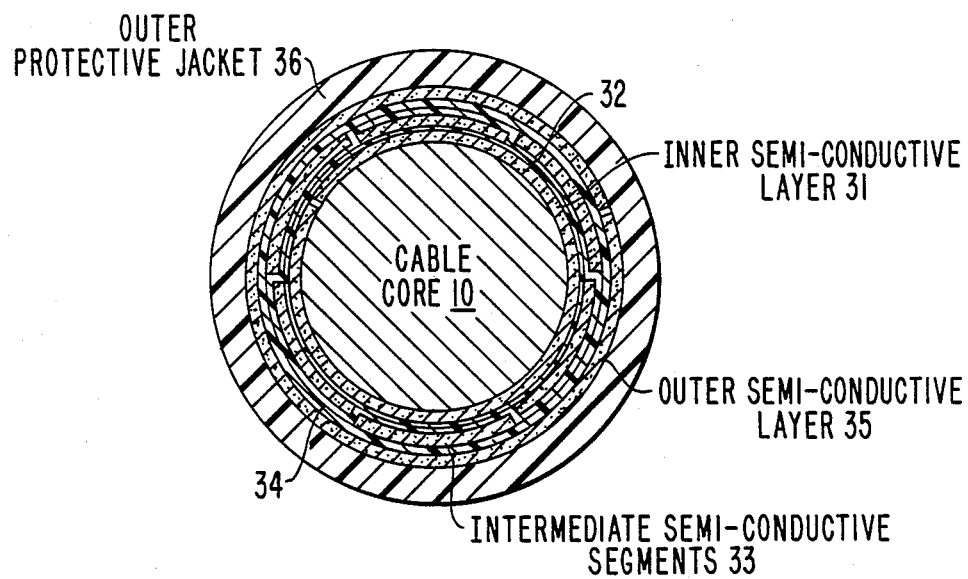
FIG. 15 is a section through a cable wrapped with three semi-conductive layers.

When this tape is applied as an intermediary layer and laid up as in FIG. 15, a highly complex detection layer is produced. The layers are applied as follows:

First layer: 30; Semi-conductive tape: 0.95 wraps,
Second layer: 32; Insulating tape: 0.95 wraps,
Third layer: 33; Hybrid tape: 0.95 wraps,
Fourth layer: 34; Insulating tape: 0.95 wraps,
Fifth layer: 35; Semi-conductive tape: 0.95 wraps,
Sixth layer: 36; Thermoplastic extrusion:

The preferred materials for all the tapes is PTFE and the insulating tapes are preferably 0.0025 inch (0.006 cm) thick and semi-conductive tapes 0.005 inch (0.0013 cm) thick.

Figure 16:
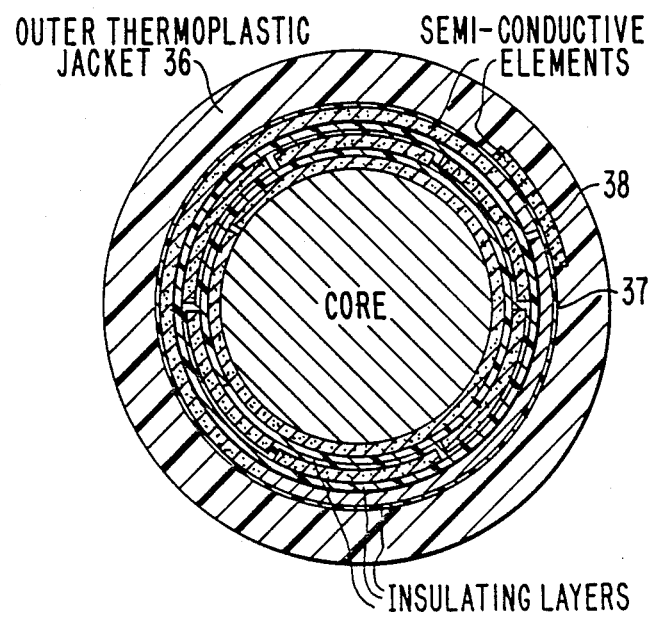
FIG. 16 and 17 are sections through modified forms of the wrapped cable of FIG. 16.

If a further insulating layer 37 is added followed by one more semi-conducting element 38 as in FIG. 16, a very effective "trip-wire" system can be incorporated. This element may be of narrow dimension (less than 1 mm) and attempts to remove a section of the outer jacket, would cause high probability of cutting this element. To increase this probability, adhesive is applied to the outer surface of this element such that it is bonded to the inner surface of the thermoplastic extruded jacket.

Figure 17:
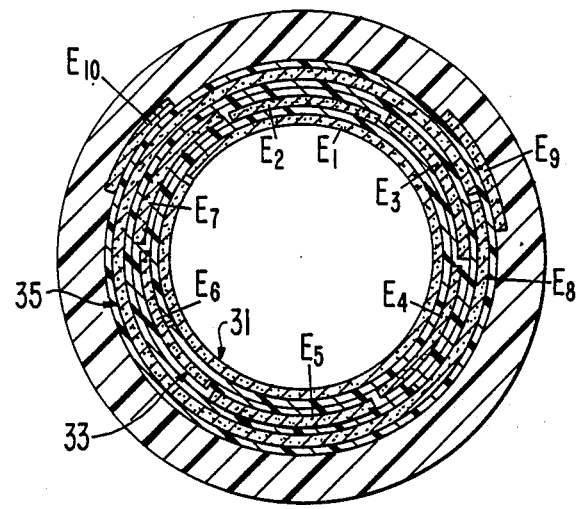

Alternatively, two semi-conductive elements may be applied over the outer insulating layer as in FIG. 17. These two elements are spaced apart and are preferably bonded to the extruded jacket. When the two elements have different potential, it becomes virtually impossible to remove a section of the jacket even if prior knowledge of the design is available.

Figure 18:
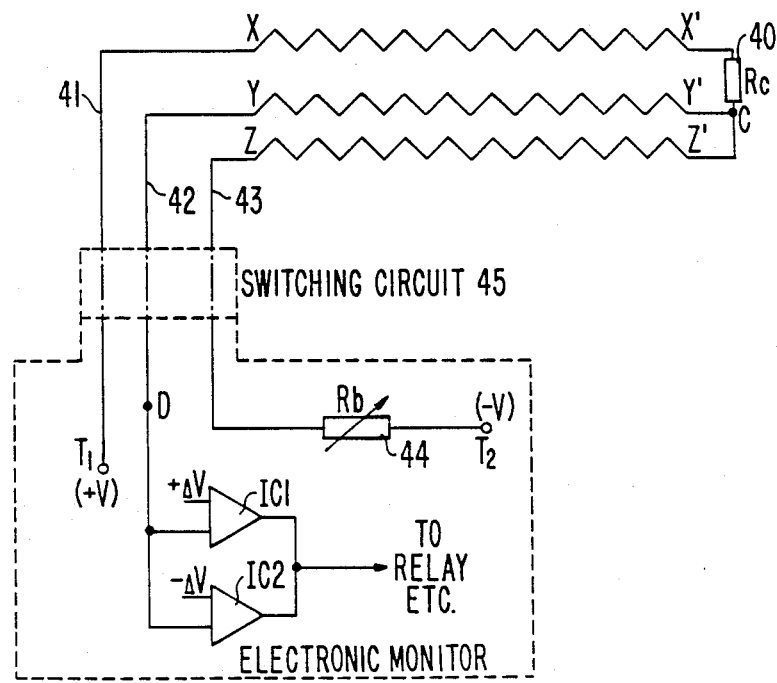
FIG. 18 is circuit diagram of another form of the security system.

In order to demonstrate the electrical operation of this design, reference is made to FIGS. 17 and 18. In the circuit of FIG. 18, three resistive arms XX', YY' and ZZ' are connected together at one end, XX' and YY' being interconnected via a resistor 40 of value Rc. YY' and ZZ' are directly interconnected at node C. The opposite end of XX' is connected via lead 41 to terminal $T_1$ at $+V$ volts. The opposite end of YY' is connected via lead 42 at node D to IC1 and IC2 and the opposite end of ZZ' in connected via lead 43 and resistor 44 of value Rb to terminal $T_2$ at $-V$ volts.

The null position is set close to zero volts and preferably not exactly zero but of the order of $+$ or $-100$ mV. In order to achieve this, balance arms XX' and ZZ' are approximately equal and Rc is equal to Rb. Rb is adjustable to finely tune the circuit. Therefore, node C is close to zero volts and node D is close to zero volts since the input impedance of the comparator circuits is very high.

Referring to FIG. 17, the semi-conductive elements of the inner conductive layer 31 is indicated by $E_1$, the elements of the hybrid third layer 33 by $E_2$-$E_7$, the element of the fifth layer 35 by $E_8$ and the two outermost elements by $E_9$ and $E_{10}$.

If elements $E_1$ and $E_8$ are connected to form arm YY' of FIG. 18, elements $E_2$, $E_3$, $E_6$ and $E_{10}$ are connected in parallel to form arm XX' and elements $E_4$, $E_5$, $E_7$ and $E_9$ are connected in parallel to form arm 22', the circuit will be in balance. If any one or more elements is open circuit or if any two elements from different arms are shorted together, then the circuit will imbalance and the alarm will sound. By incorporation of a switching circuit 45 to vary the connections, a pre-selected program may be used which will confront any interceptor with a random pattern of terminations.

If the elements in the hybrid layer are made very narrow (less than 1mm wide) a great number of permutations can be pre-set into the detection layer. Another advantage of this system is that a situation may occur whereby an alarm is sounded due to a very small incision in the detection layer and the affected elements may be switched out, leaving the rest of the detection layer operational and thus continuing to provide cover until a repair can be effected.

While the invention has beendisclosed herein in connection with certain embodiments and detailed descriptions, it will be clear to one skilled in the art that modifications or variations of such details can be made without deviating from the gist of the invention, and such modifications or variations are considered to be within the scope of the claims hereinafter:

I claim:

1. A signal-carrying member for a security system comprising a core surrounded by means capable of transmitting an electrical signal, an electrically-insulating layer surrounding the core and said means capable of transmitting a signal, and a semi-conductive layer surrounding the insulating layer, the semi-conductive layer incorporating throughout semi-conductive fibres which protrude from the layer when the layer is pierced, the thickness of the insulating layer being substantially less than the length of such protruding fibres whereby piercing of the semi-conductive layer and the insulating layer by an object entering from outside and moving towards the core will cause semi-conductive fibres from the semi-conductive layer to form an electrical conductive path between the semi-conductive layer and said means capable of transmitting a signal.

2. A signal-carrier member according to claim 1 wherein said means capable of transmitting an electrical signal is an inner semi-conductive layer surrounding the core and separated from the first mentioned outer semi-conductive layer by said insulating layer.

3. A signal-carrier member according to claim 1 wherein said insulating layer comprises a helical winding of insulating tape caring a semi-conductive tape over less than half the width of the insulating tape, the semi-conductive tape forming said semi-conductive layer.

4. A signal-carrier member according to claim 2 having thereon at least two helical windings of insulating tape carrying semi-conductive tape over less than half the width of the insulating tape, the two windings of the semi-conductive tape forming said inner and outer semi-conductive layers.

5. A signal-carrier member according to claim 2 or claim 4 to which a resistance-bridge-type detector is connected, each semi-conductive layer forming at least part of one arm of the resistance bridge.

6. A signal-carrier member according to claim 5 wherein an insulated wire extends within at least one of the windings and is connected to the outer ends of the semi-conductive layers and to a terminal of the detector.

7. A signal-carrier member according to claim 5 wherein a fixed resistor is connected in series with one semi-conductive layer and a variable resistor is connected in series with the other semi-conductive layer.

8. A signal-carrier member according to claim 5 having one or more further wrappings of semi-conductive tape, the various semi-conductive tapes being interconnected to form more than two arms of equal resistance and connected to the detector.

9. A signal-carrier member according to claim 8 wherein the semi-conductive tapes which are interconnected to form one of said arms are selected from different wrapping layers.

10. A signal-carrier member according to claim 3 or claim 4 wherein the or each insulating tape winding is wound from an insulating tape carrying thereon two or more parallel spaced semi-conductive tapes.

11. A signal-carrier member according to claim 5 having a switching device electrically connected between the semi-conductive layers and the detector and operable at will to vary the electrical connections between the said layers and the detector.

* * * * *